US010996736B2

(12) United States Patent
Bachrany et al.

(10) Patent No.: US 10,996,736 B2
(45) Date of Patent: May 4, 2021

(54) WIRELESS CAPACITIVE PRESENCE DETECTION

(71) Applicants: Vlamir Bachrany, São Paulo (BR); Leonir Veneziani Silva, São Paulo (BR); Alexandra Aparecido Paulino, São Paulo (BR); Renato Pisani Gomes Da Silva, São José dos Campos (BR)

(72) Inventors: Vlamir Bachrany, São Paulo (BR); Leonir Veneziani Silva, São Paulo (BR); Alexandra Aparecido Paulino, São Paulo (BR); Renato Pisani Gomes Da Silva, São José dos Campos (BR)

(73) Assignees: INTERNATIONAL BUSINESS MACHINES CORPORATION, Armonk, NY (US); TIRANTE A INDUSTRIA ELETRONICA LTDA, Sao Jose Dos Campos (BR)

( * ) Notice: Subject to any disclaimer, the term of this patent is extended or adjusted under 35 U.S.C. 154(b) by 117 days.

(21) Appl. No.: 16/295,541

(22) Filed: Mar. 7, 2019

(65) Prior Publication Data
US 2020/0285295 A1 Sep. 10, 2020

(51) Int. Cl.
*G01R 27/26* (2006.01)
*G06F 1/3231* (2019.01)
(Continued)

(52) U.S. Cl.
CPC ..... *G06F 1/3231* (2013.01); *G01R 19/16542* (2013.01); *G01R 27/2605* (2013.01); *H03K 17/955* (2013.01)

(58) Field of Classification Search
CPC ............ G06F 1/3231; G01R 19/16542; G01R 27/2605; H03K 17/955
(Continued)

(56) References Cited

U.S. PATENT DOCUMENTS 5,119,036 A * 6/1992 Rickards .................. G01B 7/14
324/662
6,225,710 B1 * 5/2001 Palata .................. H03K 17/955
307/109
(Continued)

FOREIGN PATENT DOCUMENTS

JP 2010181369 8/2010

OTHER PUBLICATIONS

Anonymous, "Capacitive-based human proximity detection for system wake-up and interrupt", http://www.ti.com/lit/ug/tidu519b/tidu519b.pdf, TI Designs, Nov. 2014, 44 pages.
(Continued)

*Primary Examiner* — Tung X Nguyen
*Assistant Examiner* — Robert P Alejnikov, Jr.
(74) *Attorney, Agent, or Firm* — Jay Wahlquist; Andrew D. Wright; Roberts Calderon Safran & Cole, P.C.

(57) ABSTRACT

Systems and methods for wireless capacitive presence detection are disclosed. In embodiments, a method includes: generating, by a tank circuit of a wireless presence detector, an electric field applied to a balanced electrode of the wireless presence detector utilizing power from a battery of the wireless presence detector; measuring, by a capacitive sensor of the wireless presence detector, a change in capacitance of the balance electrode; determining, by a microcontroller of the wireless presence detector, that the change in capacitance indicates a presence of a person within a predetermined distance of the balance electrode; and sending, by a radio circuit of the wireless presence detector, an alert to a remote gateway using a radio frequency sub-gigahertz (Ghz) transmission, wherein the alert is based on the determining that the change in capacitance indicates the presence of a person within the predetermined distance of the balance electrode.

25 Claims, 7 Drawing Sheets

(51) Int. Cl.
*G01R 19/165* (2006.01)
*H03K 17/955* (2006.01)

(58) Field of Classification Search
USPC .................................................. 324/686, 662
See application file for complete search history.

(56) References Cited

U.S. PATENT DOCUMENTS

| | | | |
|---|---|---|---|
| 6,731,209 B2* | 5/2004 | Wadlow | G01D 5/24 324/686 |
| 6,819,242 B2 | 11/2004 | Michael | |
| 7,019,641 B1 | 3/2006 | Lakshmanan et al. | |
| 7,135,983 B2 | 11/2006 | Filippov et al. | |
| 7,387,619 B2* | 6/2008 | Kitamura | A61F 5/451 324/686 |
| 9,268,390 B2 | 2/2016 | Gear et al. | |
| 2003/0009273 A1* | 1/2003 | Stanley | G08B 13/26 701/45 |
| 2009/0027068 A1* | 1/2009 | Philipp | G01R 27/26 324/678 |
| 2010/0026479 A1* | 2/2010 | Tran | A61B 5/02042 340/501 |
| 2010/0123560 A1* | 5/2010 | Nix | H04Q 9/00 340/10.4 |
| 2012/0278640 A1 | 11/2012 | Caglianone | |
| 2014/0015595 A1 | 1/2014 | Van Ausdall et al. | |
| 2016/0018867 A1* | 1/2016 | Nys | G06F 1/3231 324/674 |
| 2018/0224924 A1* | 8/2018 | Dinger | G01R 27/2605 |
| 2019/0052637 A1* | 2/2019 | Dean | H04W 12/04 |

OTHER PUBLICATIONS

Madeira et al., "A machine learning approach for indirect human presence detection using IOT devices", https://ieeexplore.ieee.org/document/7829781/, the Eleventh International Conference on Digital Information Management, Jan. 26, 2017, 6 pages.

Klaisoongnoen, "Real-Time Workspace Occupancy Sensing Based on AWS IoT", https://www.hackster.io/data-innovation-lab-axa-germany/real-time-workspace-occupancy-sensing-based-on-aws-iot-bd082e, Data Innovation Lab | AXA Germany, Jul. 18, 2017, 7 pages.

Anonymous, "Workplace Occupancy Sensing", https://www.condecosoftware.com/products/workspace-occupancy-sensor/, Condeco Group Ltd, accessed Jan. 31, 2019, 4 pages.

Kinney, "Proximity Sensors Compared: Inductive, Capacitive, Photoelectric, and Ultrasonic", http://www.machinedesign.com/sensors/proximity-sensors-compared-inductive-capacitive-photoelectric-and-ultrasonic, Machine Design, Sep. 1, 2001, 8 pages.

George et al., "A Combined Inductive-Capacitive Proximity Sensor for Seat Occupancy Detection", http://ieeexplore.ieee.org/abstract/document/5439846/, IEEE Transactions on Instrumentation and Measurement vol. 59, Issue: 5, May 2010, 2 pages.

* cited by examiner

WIRELESS CAPACITIVE PRESENCE DETECTION

BACKGROUND

The present invention relates generally to presence detection and, more particularly, to wireless capacitive presence detection.

A variety of solutions have been implemented for determining the presence of humans within a work environment. Some solutions utilize sensors hardwired to computer work stations to determine occupancy of the work stations and perform power management functions to control power consumption of the computer work stations. Sensors utilized in such implementations include a variety of motion sensors, such as cameras and the like.

SUMMARY

In an aspect of the invention, a computer-implemented method includes: generating, by a tank circuit of a wireless presence detector, an electric field applied to a balanced electrode of the wireless presence detector utilizing power from a battery of the wireless presence detector; measuring, by a capacitive sensor of the wireless presence detector, a change in capacitance of the balance electrode; determining, by a microcontroller of the wireless presence detector, that the change in capacitance indicates a presence of a person within a predetermined distance of the balance electrode; and sending, by a radio circuit of the wireless presence detector, an alert to a remote gateway using a radio frequency sub-gigahertz transmission, wherein the alert is based on the determining that the change in capacitance indicates the presence of a person within the predetermined distance of the balance electrode.

In another aspect of the invention, there is a wireless capacitive presence detector including: a power circuit including a battery and a power manager configured to supply a stable voltage to a microcontroller during a life of the battery; a radio circuit connected to the power circuit through the microcontroller, the radio circuit configured to send an alert comprising a digital low power signal of less than 1 gigahertz; and a sensor circuit connected to the power circuit through the microcontroller, the sensor circuit including a capacitive sensor, a tank oscillator and a balanced electrode, wherein the capacitive sensor is configured to measure a distortion on an electric field generated by the tank oscillator and applied to the balanced electrode; wherein the microcontroller is configured to generate the alert based on the distortion measured by the capacitive sensor when the distortion indicates a presence of a person within a predetermined distance of the balanced electrode according to predetermined parameters stored at the microcontroller.

In another aspect of the invention, there is a system including: a wireless presence detector affixed to a work station comprising: a power circuit including a battery and a power manager configured to supply a stable voltage to a microcontroller during a life of the battery; a radio circuit connected to the power circuit through the microcontroller, the radio circuit configured to send an alert comprising a digital low power signal of less than 1 gigahertz; and a sensor circuit connected to the power circuit through the microcontroller, the sensor circuit including a capacitive sensor, a tank oscillator and a balanced electrode, wherein the capacitive sensor is configured to measure changes in capacitance of the balanced electrode due to distortions in an electric field generated by the tank oscillator. The system also includes a gateway in wireless communication with the wireless presence detector, wherein the gateway is adapted to receive alerts from the radio circuit indicating a change in an occupancy status of the work station and transmit messages to a server indicating the change in occupancy status of the work station.

In another aspects of the invention, there is a system including: a plurality of wireless presence detectors, wherein each of the plurality of wireless presence detectors is associated with one of a plurality of work stations in a work environment and includes: a power circuit including a battery and a power manager configured to supply a stable voltage to a microcontroller during a life of the battery; a radio circuit connected to the power circuit through the microcontroller, the radio circuit configured to send an alert comprising a digital low power signal of less than 1 gigahertz; and a sensor circuit connected to the power circuit through the microcontroller, the sensor circuit including a capacitive sensor, a tank oscillator and a balanced electrode, wherein the capacitive sensor is configured to measure changes in capacitance of the balanced electrode due to distortions in an electric field generated by the tank oscillator. The system also includes a gateway in wireless communication with the plurality of wireless presence detectors, wherein the gateway is adapted to receive radio frequency sub-gigahertz alerts from the plurality of wireless presence detectors indicating a change in an occupancy status of an associated one of the plurality of work stations and transmit encrypted messages to a remote server via a network indicating the change in occupancy status of the associated one of the plurality of work stations.

In another aspect of the invention, there is a system including: a gateway in communication with a server via a network; and a plurality of wireless presence detectors, wherein each of the plurality of wireless presence detectors is associated with one of a plurality of work stations in a work environment and includes: a battery; a radio circuit; a balance electrode; and a microcontroller having a processor, a computer readable memory and a computer readable storage medium associated with the microprocessor; program instructions to measure a change in capacitance of the balance electrode; program instructions to determine that the change in capacitance indicates a change in an occupancy status of an associated one of the plurality of work stations; and program instructions to send an alert to the gateway via the radio circuit using a radio frequency sub-gigahertz transmission, wherein the alert is based on the determining the change in the occupancy status, and wherein the program instructions are stored on the computer readable storage medium for execution by the microcontroller via the computer readable memory.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The present invention relates generally to presence detection and, more particularly, to wireless capacitive presence detection. In embodiments, a system is provided for detecting the occupancy of corporate work stations in real time or near real time utilizing wireless battery powered capacitive presence detectors. In aspects, a presence detector includes a power circuit comprising a battery and a low power direct current (DC) to DC converter supplying a stable voltage during the life of the battery. In aspects, a radio circuit is connected to the power circuit through a microcontroller and is configured to send an alert in the form of a low power signal of less than 1 gigahertz (GHz) using an IEEE802.15.4 stack. Additionally, a sensor circuit is connected to the power circuit through the microcontroller, and includes a capacitive sensor, a tank oscillator and a balanced electrode. The capacitive sensor is configured to measure a distortion in an electric field generated by the tank oscillator and applied to the balanced electrode. In implementations, the microcontroller manages the radio and sensor circuits to enable the generation of the alert based on a result received from the sensor circuit when the result indicates a presence or absence of a person at a work station according to predetermined criteria.

With the growing demand for work environments that can be optimized to reduce costs, companies are looking for solutions that can control spaces in such work environments dynamically, while respecting privacy concerns of employees and partners. Management and monitoring of such spaces must occur in real time, with efficiency and accuracy of information generated, and with low operating costs, but must also allow for dynamic allocation of corporate positions independent of facilities teams. Embodiments of the invention enable the detection of the presence of a human body at a work station, with a low rate of false alarms or failures, at a low operational cost, and at a high level of scalability in an Internet of Things (IoT) enabled environment.

Embodiments of the invention provide a plurality of work stations in a work environment, wherein each work station includes a presence detector mounted thereon for detecting the presence of a person in a working position at the work station. For example, in embodiments, each work station has a presence detector mounted to an underside of a table or desktop (i.e., bottom wall of a desktop). In implementations, each presence detector determines when a respective work station is occupied using a capacitive sensor and sends an unstructured data signal to a gateway. In aspects, the gateway is configured to enrich the unstructured data signals received from respective presence detectors and send one or more messages to a server to provide the server with accurate occupancy information for the work stations. The server may use the information relayed in the one or more messages to trigger other IoT devices such as air conditioning systems or ambient lighting systems to perform functions based on the occupancy status of one or more work stations. Solutions of the present invention ensure that the identification, control, management and monitoring of work stations occurs without violating user (employee) privacy, working group confidentiality, or the confidentiality of ongoing projects. For example, embodiments of the invention do not utilize or require cameras for presence detection, therefore complying with legal requirements and/or privacy concerns specific to certain countries and/or work cultures.

Given the frequent movement of users between work stations in some environments, sensing the presence of individual users would not result in a system having control over work station layouts (e.g., meeting rooms or work positions) in a corporate location. Moreover, devices requiring wired connections (e.g., power cords) are not efficient, as they can create dependencies on structural works and limit possible configurations of work stations/layouts within a work environment. Additionally, in situations where IoT devices are coordinated in a work environment, the IoT devices require communication of data to platforms that normalize the data, as well as allow them to be controlled as part of available on-site assets.

Unlike previous solutions for determining work station occupancy utilizing motion sensors, embodiments of the present invention do not differentiate between objects in motion, and there is no need for a person to move for the presence of the person to be detected. Further, unlike proximity, presence and/or heat sensors that may interpret a chair or a hot body below a table as a person, embodiments of the present invention are calibrated such that only objects that change the electric field of the presence detector change the state (e.g., unoccupied to occupied), and thereafter generate an occupancy alert.

Moreover, unlike other solutions, presence detectors of the present invention are wireless and energy efficient, so that a single battery can provide enough power for a mobile presence detector of the invention to remain active for months or years. Additionally, being wireless, presence detectors of embodiments of the present invention enable reconfiguration of work stations without the need for the reconfiguration of power cords and other connectors. Advantageously, embodiments of the invention monitor work stations in real time to: (1) provide presence detection at reduced operational costs with low impact on information technology (IT) infrastructure; (2) reduce infrastructure costs through the use of work stations that allow workers to rotate positions within a work environment; (3) enable optimization of occupied work stations to reduce costs of physical and logical infrastructure (e.g., provides a better occupancy rate for work environments with multiple work stations); and (4) enable the reorganization/reconfiguration of functional work station layouts according to business needs (e.g., call centers, auditing, special client projects, etc.).

Advantageously, embodiments of the invention provide improved capacitive presence detectors, which constitute improvements in the technology field of presence detection. More specifically, aspects of the invention utilize unconventional steps to enable a presence detector to maintain battery life while providing presence information to a gateway in real-time. Thus, embodiments of the invention provide technical solutions to the technical problems associated with determining the presence of workers at a plurality of work stations.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 1:
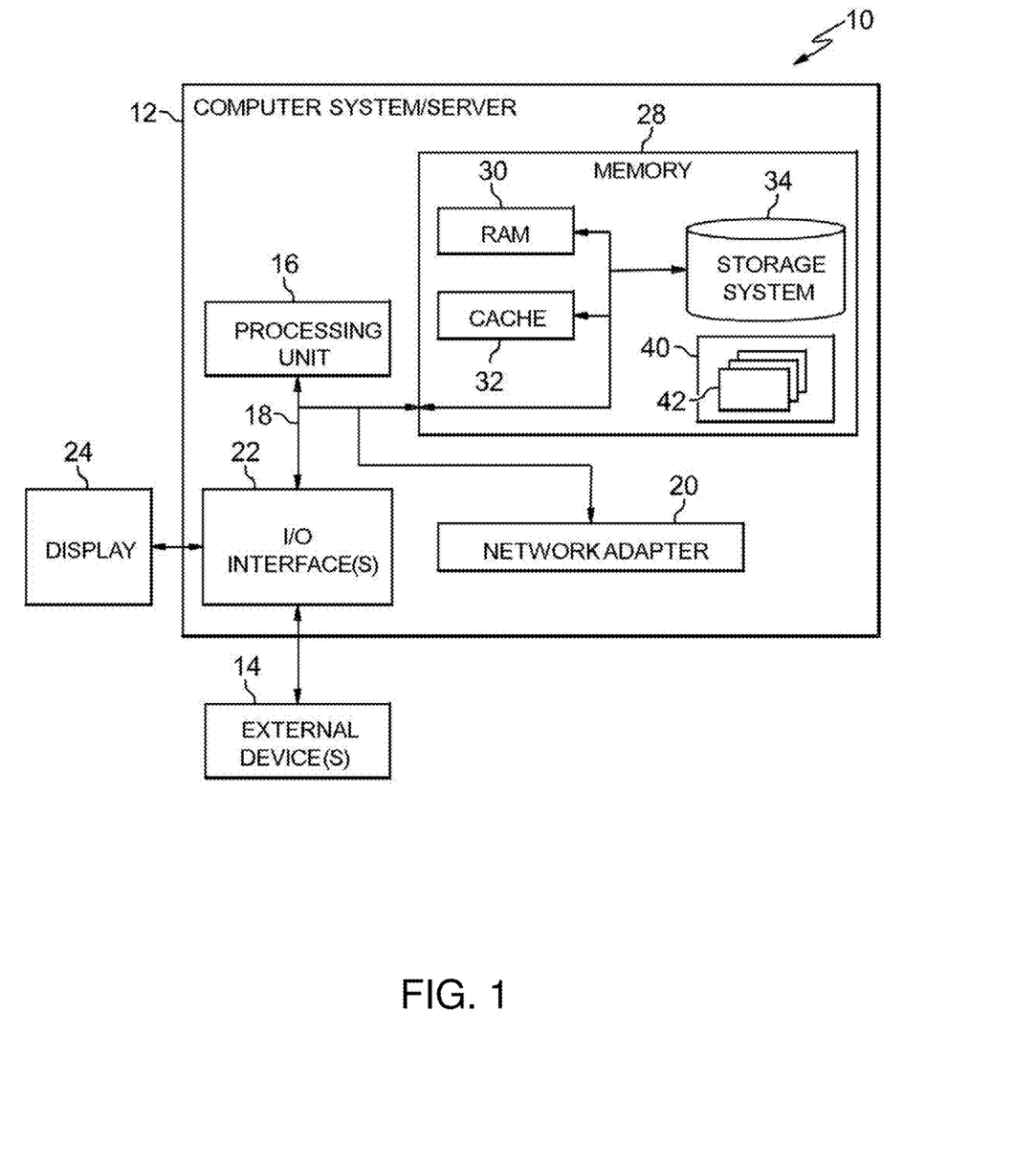
FIG. 1 depicts a computing infrastructure according to an embodiment of the present invention.

Referring now to FIG. 1, a schematic of an example of a computing infrastructure is shown. Computing infrastructure 10 is only one example of a suitable computing infrastructure and is not intended to suggest any limitation as to the scope of use or functionality of embodiments of the invention described herein. Regardless, computing infrastructure 10 is capable of being implemented and/or performing any of the functionality set forth hereinabove.

In computing infrastructure 10 there is a computer system (or server) 12, which is operational with numerous other general purposes or special purpose computing system environments or configurations. Examples of well-known computing systems, environments, and/or configurations that may be suitable for use with computer system 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 12 may be described in the general context of computer system executable instructions, such as program modules, being executed by a computer system. Generally, program modules may include routines, programs, objects, components, logic, data structures, and so on that perform tasks or implement particular abstract data types. Computer system 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system 12 in computing infrastructure 10 is shown in the form of a general-purpose computing device. The components of computer system 12 may include, but are not limited to, one or more processors or processing units (e.g., CPU) 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 12 typically includes a variety of computer system readable media. Such media may be any available media that is accessible by computer system 12, and it includes both volatile and non-volatile media, removable and non-removable media.

System memory 28 can include computer system readable media in the form of volatile memory, such as random access memory (RAM) 30 and/or cache memory 32. Computer system 12 may further include other removable/non-removable, volatile/non-volatile computer system storage media. By way of example only, storage system 34 can be provided for reading from and writing to a nonremovable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 12 may also communicate with one or more external devices 14 such as a keyboard, a pointing device, a display 24, etc.; one or more devices that enable a user to interact with computer system 12; and/or any devices (e.g., network card, modem, etc.) that enable computer system 12 to communicate with one or more other computing devices. Such communication can occur via Input/Output (I/O) interfaces 22. Still yet, computer system 12 can communicate with one or more networks such as a local area network (LAN), a general wide area network (WAN), and/or a public network (e.g., the Internet) via network adapter 20. As depicted, network adapter 20 communicates with the other components of computer system 12 via bus 18. It should be understood that although not shown, other hardware and/or software components could be used in conjunction with computer system 12. Examples, include, but are not limited to: microcode, device drivers, redundant processing units, external disk drive arrays, RAID systems, tape drives, and data archival storage systems, etc.

Figure 2:
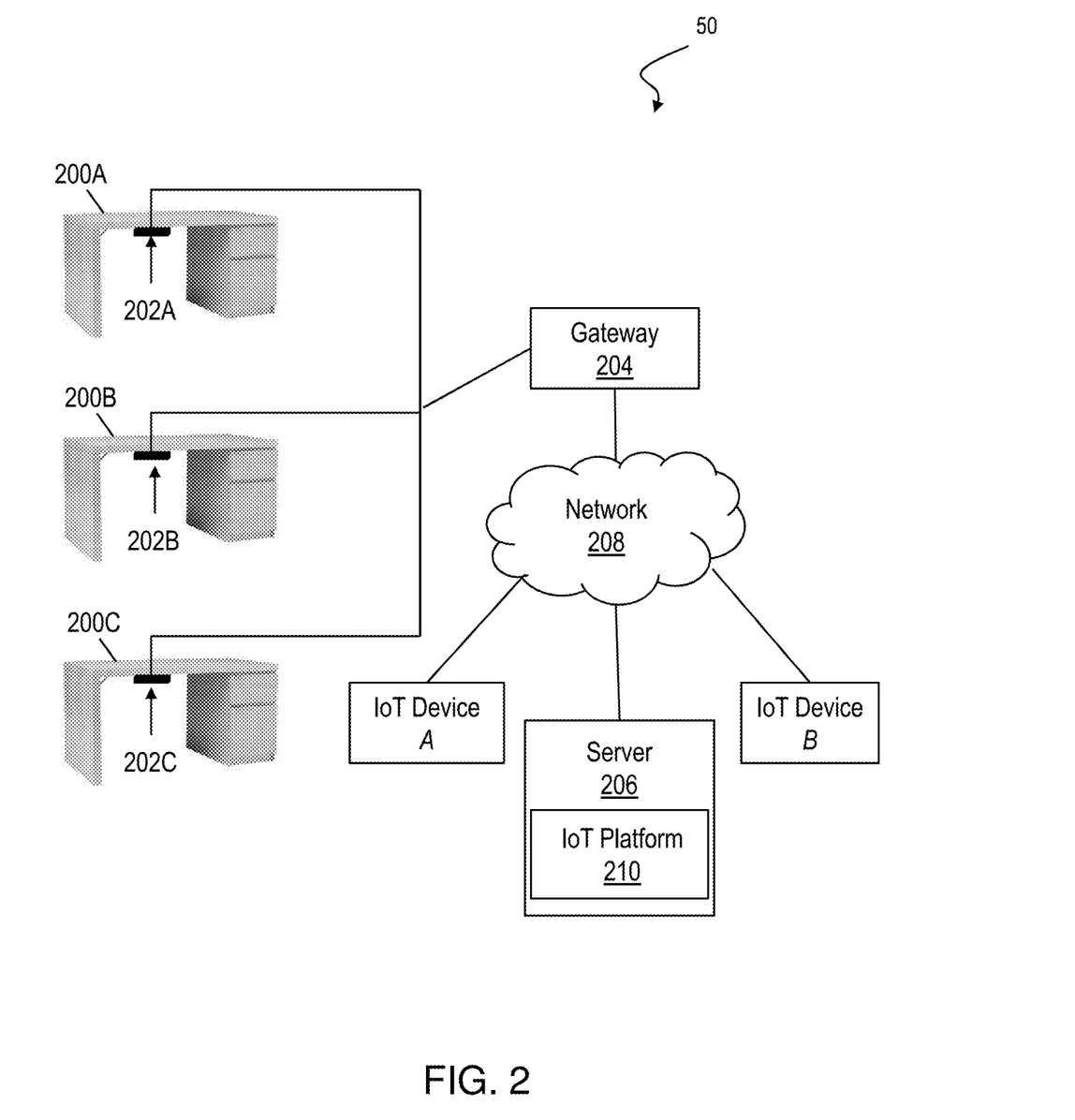
FIG. 2 shows an exemplary environment in accordance with aspects of the invention.

FIG. 2 shows an exemplary environment 50 in accordance with aspects of the invention. The environment 50 includes a plurality of work stations indicated at 200A-200C, each of which includes a respective wireless capacitive presence detector (hereafter presence detector) 202A-202C mounted thereto. While work stations 200A-200C are depicted as desks, any type of work station may be equipped with a presence detector 202A-202C, wherein the presence detectors 202A-202C are mounted adjacent a space intended for occupation by a person. In embodiments of the invention, the presence detectors 202A-202C are mounted to an underside (bottom outer wall) of a tabletop or desktop as illustrated in FIG. 2.

In the exemplary environment 50 shown, the presence detectors 202A-202C are wirelessly connected to a gateway 204, which is wirelessly connected to a server 206 via a network 208. In aspects, the gateway 204 comprises a hardware device (e.g., network node) that connects two networks using different protocols. In implementations, the presence detectors 202A-202C are configured to send unstructured data to the gateway 204, and the gateway 204 is configured to convert the unstructured data into an encrypted format for transmission to the server 206 via the network 208. In embodiments, the gateway 204 utilizes an encrypted Message Queuing Telemetry Transport (MQTT) protocol, which is an International Organization for Standardization (ISO) standard publish-subscribe-based messaging protocol. The gateway 204 may comprise the elements of the computer system 12 of FIG. 1.

In aspects of the invention, the server 206 is in communication with one or more Internet of Things (IoT) devices, represented by IoT device A and IoT device B. In embodiments, server 206 is a cloud-based server. In alternative embodiments, the server 206 is an on-site server (e.g., at the same location as the work stations 200A-200C). The server 206 may be in communication with one of more IoT devices directly or via the network 208. IoT devices A and B may be any device that can connect, interact and exchange data with the server 206, such as on-site devices serving the functional needs of people occupying work stations 200A-200B.

The network 208 may be any suitable communication network or combination of networks, such as a local area network (LAN), a general wide area network (WAN), and/or a public network (e.g., the Internet). In implementations, the server 206 is in the form of the computing device 12 of FIG. 1. In implementations, the server 206 includes one or more program modules (e.g., program module 42 of FIG. 1) configured to be executed by the server 206 to perform one or more of the functions described herein. In aspects, the server 206 is a specialized computing device including an IoT platform 210 (program module) configured to communicate with IoT devices (e.g., IoT devices A and B) to implement instructions. In one example, the IoT platform 210 includes rules and instructions for initiating functional changes in an IoT-enabled air conditioning system and an IoT-enabled work station lighting system.

The quantity of devices and/or networks in the environment 50 is not limited to what is shown in FIG. 2. In practice, the environment 50 may include additional devices and/or networks; fewer devices and/or networks; different devices and/or networks; or differently arranged devices and/or networks than illustrated in FIG. 2. For example, the environment 50 may include a second set of work stations in communication with a second gateway (not shown), wherein the second gateway communicates information to the server 206 or another server (not shown) based on information gathered from presence detectors at the second set of work stations.

Figure 3A:
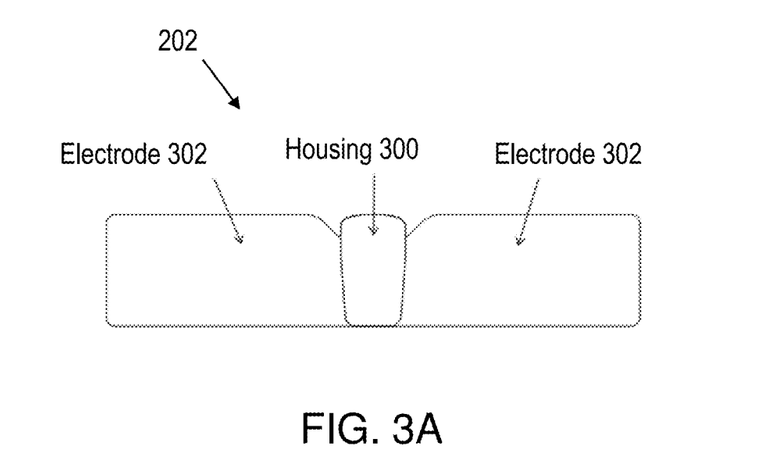
FIGS. 3A and 3B show an exemplary wireless capacitive presence detector in accordance with aspects of the invention.
Figure 3B:
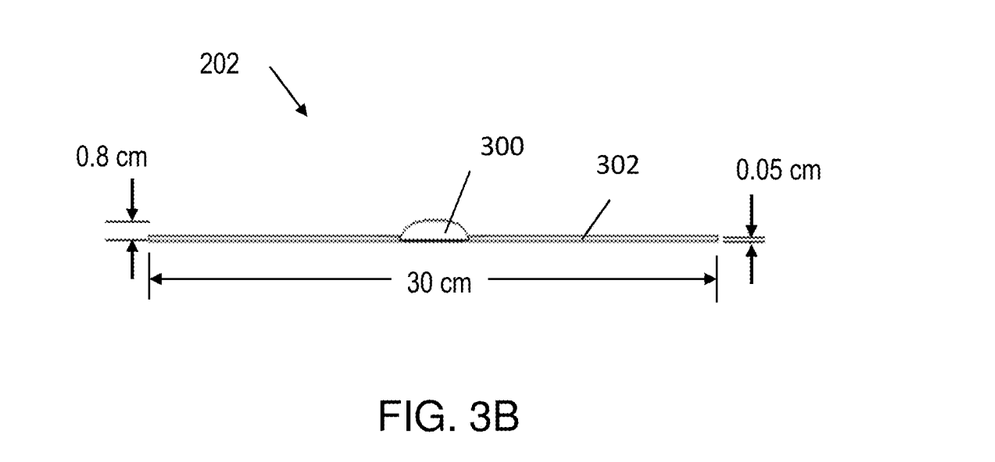

FIGS. 3A and 3B show an exemplary presence detector in accordance with aspects of the invention. The presence detector of FIGS. 3A and 3B may be utilized in the exemplary environment 50 of FIG. 2.

FIG. 3A depicts a top view of a presence detector 202 in accordance with embodiments of the invention, including a housing 300 and an electrode 302. In embodiments, structural characteristics of the presence detector 202 result in a thin, easily mountable device. A variety of methods may be utilized to attach the presence detector 202 to a work station, including connectors such as screws, adhesives and hook and loop fasteners.

FIG. 3B depicts a side view of the presence detector 202 of FIG. 3A. In implementations, the presence detector 202 comprises a thin profile. For example, in embodiments the presence detector 202 has a total thickness from a bottom wall of the electrode 302 to a top wall of the housing 300 of 0.8 centimeters (cm) and a total thickness from the bottom wall of the electrode 302 to a top wall of the electrode 302 of 0.05 cm. In implementations, the electrode 302 has a total length from a first end to a send end of 30 cm. In implementations, the housing 300 is formed of plastic and houses the circuits and battery of the presence detector 202, as will be discussed in more detail with respect to FIG. 4. In embodiments, the presence detector 202 includes an external tag (not shown) having an identification (ID) of the presence detector 202 displayed thereon. The tag may be in the form of a sticker adhered to the presence detector 202, a printed identification number on the presence detector 202, or other forms. In use, IDs of presence detectors (202A-202C) may be mapped to locations of work stations 200A-200C in the environment 50 and delivered to a client so that computer mapping of the presence detectors 202A-202C and visualization of their status (e.g., occupied or unoccupied) may be performed at the server 206.

Figure 4:
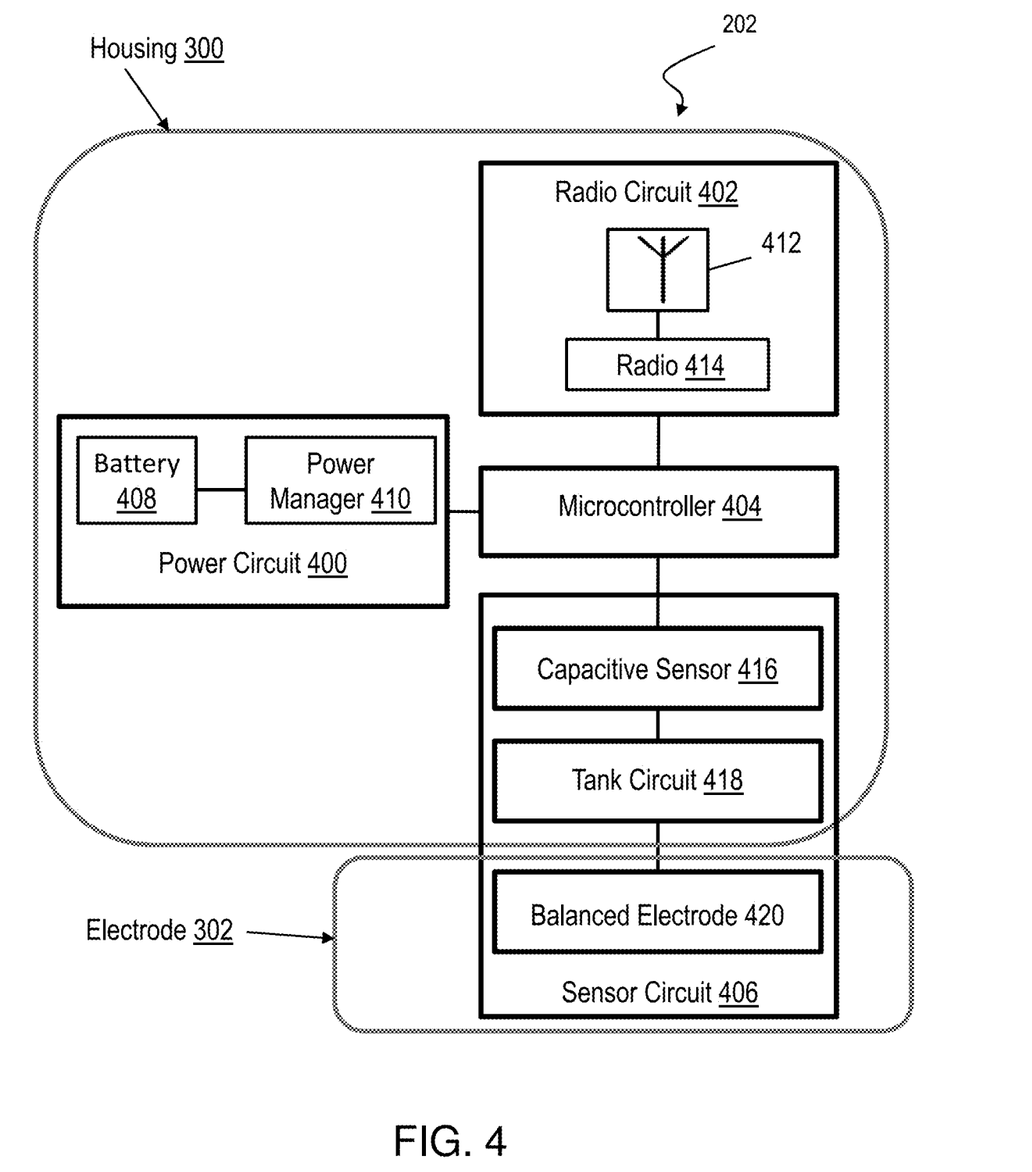
FIG. 4 shows architecture of the wireless capacitive presence detector of FIGS. 3A and 3B in accordance with aspects of the invention.

FIG. 4 shows architecture of the presence detector 202 of FIGS. 3A and 3B in accordance with aspects of the invention. As depicted, the housing 300 holds a power circuit 400, a radio circuit 402, a microcontroller 404, and portions of a sensor circuit 406. In aspects, the microcontroller 404 includes elements of the computer system 12 of FIG. 1. For example, the microcontroller 404 may include a memory 28, and program/utility 40 having at least one program module 42 programmed to implement functions of the presence detector, as will be discussed in more detail below.

Electrode 302 houses a balanced electrode 420, which comprises another portion of the sensor circuit 406. In implementations, the power circuit 400 includes a battery 408 (e.g., a button cell lithium battery, such as a CR2032 battery) and a power manager 410. In embodiments, the presence detector 202 housing is configured for access by a user so that the battery 408 may be easily replaced by an end client when necessary. In implementations, the power manager 410 is a low power DC to DC converter adapted to supply a stable voltage from the power circuit 400 to the microcontroller 404 during the entire battery life of the battery 408. In aspects, the microcontroller 404 comprises a low power 48 MHz Cortex®-M3 microcontroller by Arm™, which is adapted to control other circuits of the presence detector 202 and make intelligent decisions.

In aspects, the radio circuit 402 includes an antenna 412 and a radio 414. In embodiment, the radio 414 is a digital low power 915 MHz radio based on an IEE802.15.4 stack. In aspects, the radio 414 works on a frequency of 902-928 MHz, which provides 10 channels for reduced interference, and provides a bandwidth of 40 kilobits per second (kbps).

In embodiments, the sensor circuit 406 comprises a capacitive sensor 416 and a tank circuit 418 positioned within the housing 300, and the balanced electrode 420 in the electrode portion 302 of the presence detector 202. In implementations, the sensor circuit 406 utilizes the capacitive sensor 416 to measure distortions of an electric field applied to the balanced electrode 420 and generated by the tank circuit 418. In embodiments of the invention, a single electrode (i.e., the balanced electrode 420) is utilized by the presence detector 202 to determine the presence of a person at a work station within the environment 50. In aspects, the balanced electrode 420 comprises a double-faced printed circuit board and does not include a plastic film.

In embodiments, the presence detector 202 may include additional or fewer components than those shown in FIG. 4. In implementations, separate components may be integrated into a single computing component or module. Additionally, or alternatively, a single component may be implemented as multiple computing components or modules.

Figure 5A:
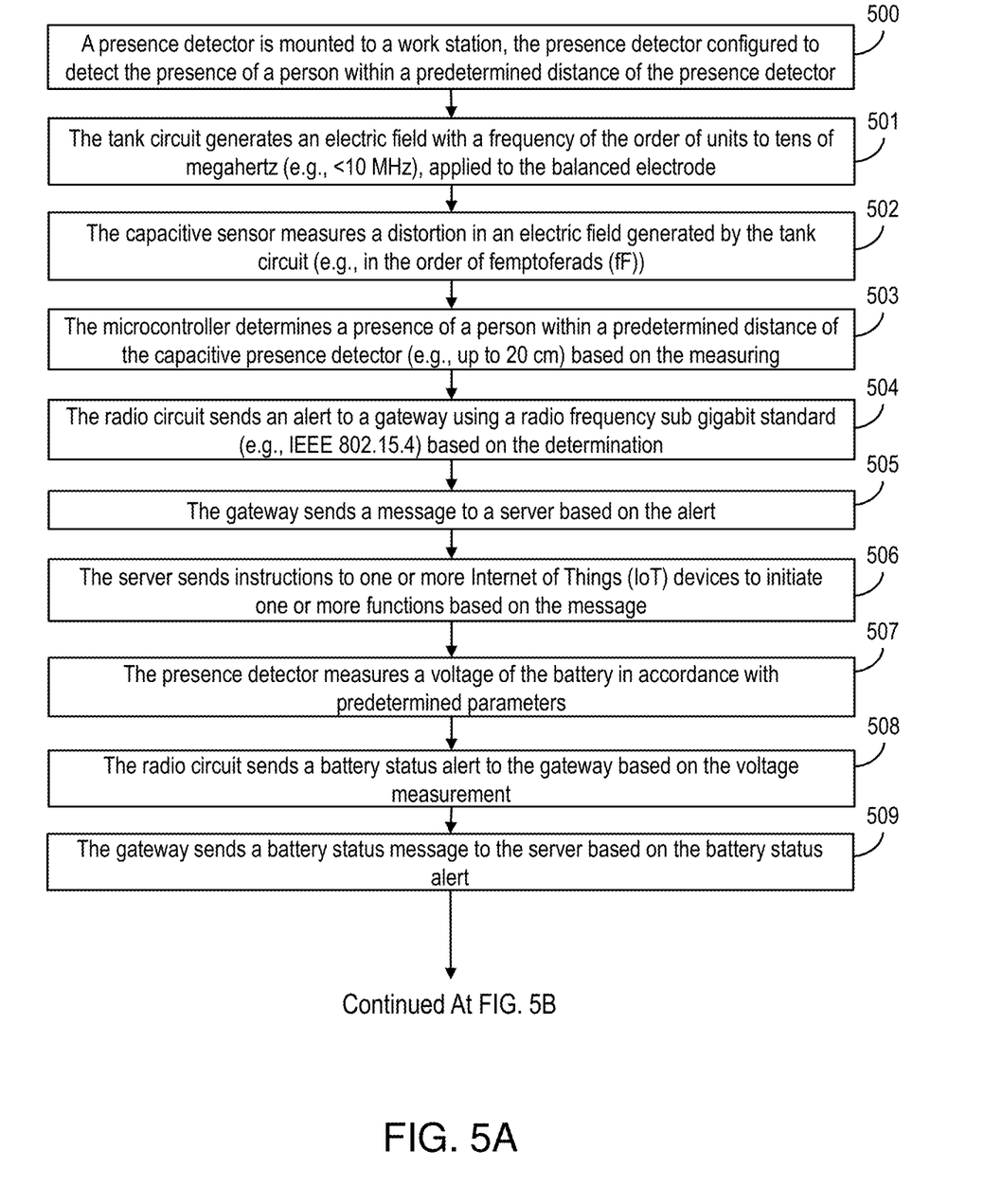
FIGS. 5A and 5B shows a flowchart of steps of a method in accordance with aspects of the invention.
Figure 5B:
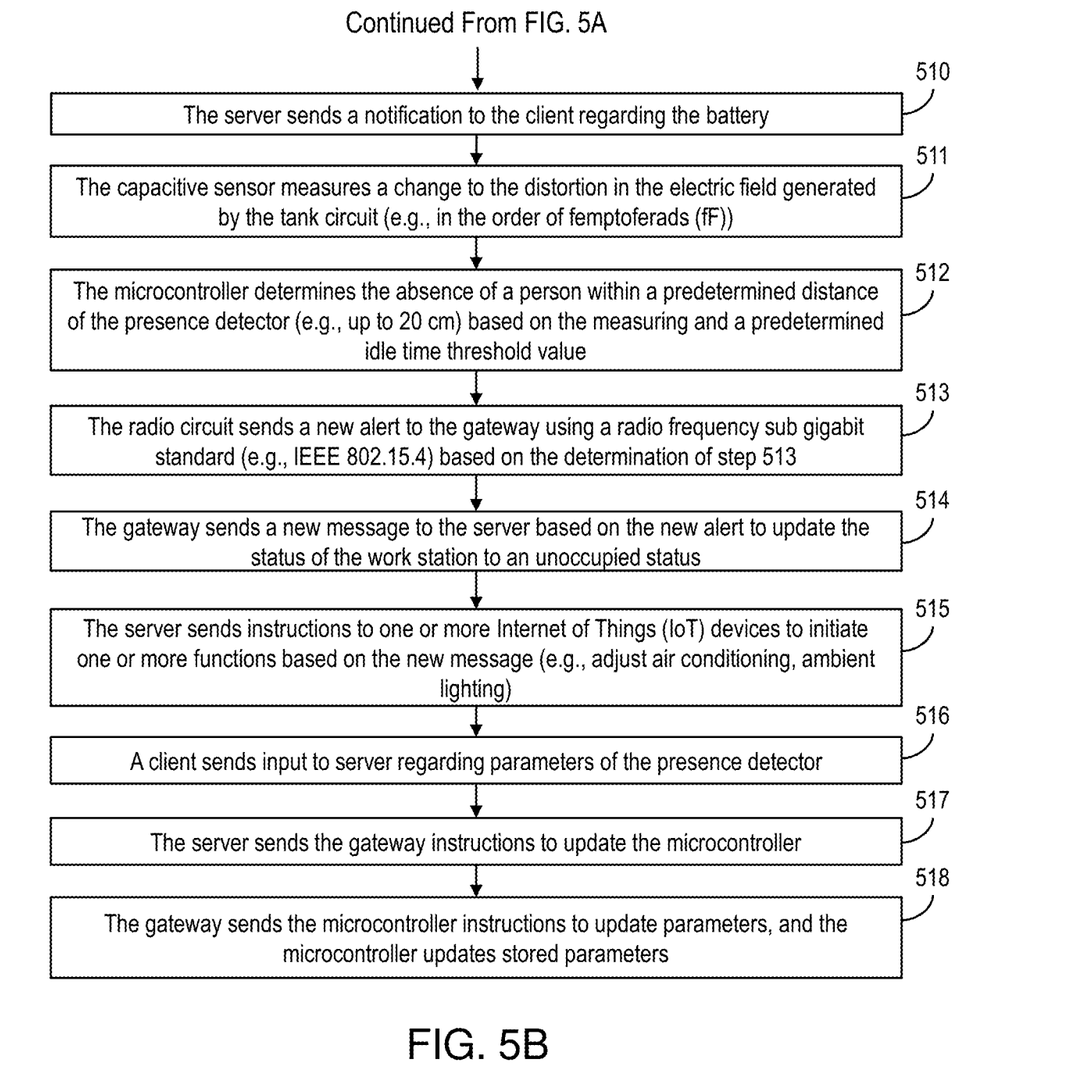

FIGS. 5A and 5B show a flowchart of a method in accordance with aspects of the invention. Steps of the method of FIGS. 5A and 5B may be performed in the environment illustrated in FIG. 2 and are described with reference to elements shown in FIGS. 2 and 4.

At step 500, in embodiments the presence detector 202 of the present invention is mounted to a work station (e.g., work station 200A), wherein the presence detector 202 is configured to detect the presence of a person within a predetermined distance of the balanced electrode 420. In implementations, the presence detector 202 is placed under a workbench, chair, tabletop or any object that does not change the capacitive characteristic of the environment 50 by a predetermined standard. While multiple presence detectors 202 of the present invention can be mounted to respective work stations within an environment 50 of the present invention, only a single presence detector 202 is discussed with respect to FIGS. 5A and 5B for simplicities sake.

Embodiments of the presence detector 202 of the present invention may be customized for specific use cases to meet various field use restrictions and generate immediate presence detection at a human-occupied work station (e.g., work station 200A). In one example, a presence detector 202 having a 30 cm long electrode configured to generate an electric field in the order of MHz is installed under a work table (e.g., work station 200A), wherein the presence detector 202 is capable of identifying characteristic capacitive variations of a human body occupying a working position at the work table (e.g., a seated position at the work table) within 20 cm of the balanced electrode 420.

At step 501, the tank circuit 418 generates an electric field, which is applied to the balanced electrode 420 of the presence detector 202. In aspects, the electric field is generated with a frequency of the order of units to tens of MHz (e.g., less than 10 megahertz). In aspects, the battery 408 supplies, through the power manager 410, power at a stable voltage to the tank circuit 418 for generation of the electric field. In implementations, the microcontroller 404 controls the supply or draw of power from the battery 408 to the microcontroller 404, radio circuit 402 and sensor circuit 406 of the presence detector 202 in accordance with sleep/wake power managements protocols, which will be discussed in more detail below.

At step 502, the capacitive sensor 416 measures capacitance of the capacitive sensor 416, which changes based on a distortion in the electric field generated by the tank circuit 418. In implementations, the capacitive sensor 416 measures a distortion in the order of femtofarads (fF). Embodiments of the present invention utilize only one capacitive sensor 416 to measure an intensity of field distortion at the balanced electrode 420, without the need for movement or touching of the presence detector 202.

At step 503, the microcontroller 404 determines a presence of a person within a predetermined distance of the balanced electrode 420 based on the measurements made by the capacitive sensor 416 at step 502. In aspects, the presence detector 202 is configured to identify capacitive variations in the surroundings of the balanced electrode 420 up to 20 cm away from the electrode 302 of the presence detector 202.

In embodiments, in order to maintain battery life of the presence detector 202, the microcontroller 404 controls a sleep/wake state of the presence detector 202 utilizing a sleep/wake protocol, wherein the presence detector 202 consumers approximately 10 micro Amperes (uA) while in the sleep state. Initially, it is noted that two processes have a higher power consumption. The first is the capacitance measurement at the capacitive sensor 416. The second is the radio frequency transmission (alert transmission) by the radio circuit 402. Accordingly, embodiments of the invention implement these steps at the lowest possible frequency and in the fastest possible time period.

In implementations, the microcontroller 404 causes the presence detector 202 to be in a wake state wherein more than 10 uA of power are consumed for only short periodic bursts. In aspects, the microprocessor 404 is in a wake state periodically to determine if measurements from the capacitive sensor 416 indicate the possible presence of a person within a predetermined distance of the balanced electrode 420. In one exemplary embodiment, the microcontroller 404 is in an initial sleep state, and enters a wake state every 3.999 seconds to determine if a distortion in the electric field generated at step 501 is indicated by the capacitive sensor 416, wherein each wake state has a duration of 5 milliseconds (ms). Thus, the microcontroller 404 makes a reading of the capacitance of the capacitive sensor 416, evaluates if there is a change in state (occupied or unoccupied) at the work station 200A, and returns to sleep after either determining no change in state or sending an alert indicating a change in state. If the capacitive sensor 416 measures a distortion indicating the possible presence of a person, the microcontroller 404 implements a new sleep/wake protocol wherein the microcontroller 404 wakes every 1.9999 seconds for a period of 5 ms to monitor measurements of the capacitive sensor 416. Thus, in implementations, the microcontroller 404 is in a wake state only 0.5% of the time. In other words, in implementations, the presence detector 202 is dormant or asleep 99.5% of the time (e.g., dormant for 995 ms and awake for 5 ms). In aspects, if the microcontroller 404 does not sense a change in status for a predetermined time period (e.g., 5 hours) the microcontroller 404 will change the sleep/wake protocol to read the state of the capacitance sensor 416 every 9.999 seconds in order to extend the life of the battery 408. In embodiments, the microcontroller 404 can be programmed to decrease battery consumption according to a predetermined calendar or time schedule. For example, the microcontroller 404 may implement custom sleep/wake protocols (e.g., readings every 9.999 seconds) on weekend or holidays to extend the life of the battery 408.

Still referencing step 503 of FIG. 5A, in embodiments the microcontroller 404 utilizes filtering algorithms and/or digital signal processing with predetermined threshold values to determine the presence of a person at the work station 200A (i.e., occupation of the work station 200A) with a high degree of precision. In implementations, initial measurements are obtained by the presence detector 202 to identify variations in electric field distortions caused by the presence of different people within a predetermined distance or range of distances from the electrode 302 of the presence detector 202. This identified range can then be utilized by the microcontroller 404 in a signal filtering step to distinguish the presence of people from that of animals or objects. In aspects, such variations are in the range of femtofarads (fF), requiring a high-resolution capacitance measurement, more specifically, a resolution of 28 bits. It is noted that even a human occupant of a work station 200A who is not moving is detected by the presence detector 202, which differentiates methods of the present invention from other technologies reliant on motion sensors.

With continued reference to FIG. 5A, at step 504 the radio circuit 402 sends an alert to the gateway 204 based on the determination at step 503 that a person is occupying the work station 200A. In implementations, the radio circuit 402 sends the alert to more than one gateway 204. In aspects, the microcontroller 404 changes the status of the radio circuit 402 from a sleep state to a wake state upon detecting the presence of a person at step 503, wherein the power circuit 400 provides power to the radio circuit 402 to enable the radio circuit 402 to transmit the alert to the gateway 204. In aspects, the transmission of the alert by the radio circuit 402 is completed in approximately 3 ms, and only occurs when there is a change of status (e.g., unoccupied to occupied) of the work station 200A as determined by the microcontroller 404 at step 503.

In embodiments, in order to provide low operational costs, the antenna 412 of the radio circuit 402 sends the alert using a radio frequency sub-gigahertz (Ghz) (sub-one-Ghz)

standard (e.g., IEEE 802.15.4), wherein the alert includes data regarding an identification (ID) of the proximity detector 202 and an indication of a change in occupancy status of the work station 200A. Utilizing frequencies below 1 GHz provides the following advantages: (1) greater range; (2) lower risk of interference with respect to on-site electronic devices such as telephones, alert systems, fire systems, etc.; (3) lower battery consumption; and (4) high scalability for sensor network growth. The table below illustrates a comparison between technologies typically known for connecting in-door allocated devices. It is observed that the Radio Frequency Sub Giga standard presents the best option for the size of payload needed (e.g., messages below 12 bytes) for embodiments of the invention, with the best coverage and scalability.

TABLE

Comparison of Radio Technologies

| FEATURE | IEEE 802.11B | BLUETOOTH | SUB GIGA RADIO FREQUENCY |
| --- | --- | --- | --- |
| BATTERY LIFE | Hours | Days | Years |
| COMPLEXITY LEVEL | Very High | High | Simple |
| RANGE | 100 meters | 10 meters | 70-300 meters |
| EXTENSION | Roaming possible | No | Yes (mesh) |
| BANDWIDTH TRANSFER RATE | 11 megabits per second (mbps) | 1 mbps | 250 kilobits per second (kbps) |

At step 505, the gateway 204 sends a message to the server 206 based on the alert received from the presence detector 202. In aspects, the role of the gateway 204 is to aggregate all messages received by Radio Frequency coverage of the environment 50. When utilizing the Radio Frequency Sub Giga architecture, the gateway 204 provides greater processing power and energy then if the environment 50 utilized direct communication between the presence detector 202 and the server 206. In aspects, the IoT platform 210 of the gateway 204 receives the alert as unstructured data, and outputs the message to the server 206 in an encrypted MQTT protocol format.

At step 506, the server 206 sends instructions to one or more IoT devices (e.g., IoT Device A, IoT device B) to initiate one or more functions based on the messaged from the gateway 204 received by the server 206 in accordance with step 505. In one example, the message received at the server 206 causes the server 206 to recognize a change in occupancy status at the work station 200A from unoccupied to occupied and sends instructions to one or more IoT devices A and B based thereon. In one example, the instructions from the server 206 cause a lighting system to change ambient lighting in the environment 50. In another example, the instructions from the server 206 cause an air conditioning system to change ambient temperature in the environment 50.

At step 507, the presence detector 202 measures a voltage of the battery 408 in accordance with predetermined parameters. In one example, the microcontroller 404 causes the power manager 410 to periodically measure the voltage of the battery 408 according to predetermined parameters received by a client. Thus, the presence detector 202 may be customized to only test the battery 408 when deemed necessary by a client or based on the particular use in an environment 50, thus reducing the battery power consumed by the presence detector 202.

At step 508, the presence detector 202 transmits a battery status alert (i.e., battery status information) to the gateway 204 based on the measurement of voltage at step 507. In aspects, the radio circuit 402 sends the battery status alert to the gateway 204 only when awakened from a sleep state by the microcontroller 404 according to predetermined parameters. In implementations, the microcontroller 404 only causes the battery status message to be sent by the radio circuit 402 when the battery has reached a predetermined power level (e.g., a critical power level of 20%) as indicated by the measurement of step 507.

At step 509, the gateway 204 sends a battery status message to the server 206 based on the battery status alert of step 508. In aspects, the gateway 204 receives the battery status alert as unstructured data and transmits the battery status message to the server 206 in an encrypted MQTT format. In implementations, the gateway 204 only sends the battery status message when the battery 408 has reached a predetermined power level (e.g., a low power level of 20%).

Turning to FIG. 5B, at step 510, the server 206 sends a notification to the client regarding the status of the battery 408. For example, the server 206 may send a low battery notification to a mobile device (not shown) of a client indicating that one or more batteries 408 within the environment 50 are at a critical state (e.g., a low power level) based on the battery status messaged received from the gateway 204 according to step 509. In implementations, the low battery notification may be in the form of a notice posted on a user interface (e.g., dashboard) provided by the server 206.

At step 511, the capacitive sensor 416 measures a change to the distortion in the electric field generated by the tank circuit 418 (e.g., in the order of fF). In implementations, the microcontroller 404 has identified the presence of a person at step 503, which changes the sleep/wake routine from a wake state wherein the microcontroller 404 reads the measurements of the capacitive sensor 416 every 3.999 seconds, to a sleep/wake routine wherein the microcontroller 404 reads the measurements of the capacitive sensor 416 every 1.999 seconds. In this example, the microcontroller 404 takes between 0.001 and 0.005 seconds to read the measurements of the capacitive sensor 416.

At step 512, the microcontroller 404 determines an absence of a person within a predetermined distance of the balanced electrode 420 (e.g., up to 20 cm) based on the measurement at step 511 and a predetermined idle time threshold parameter. In aspects, when a work station 200A is occupied, the microcontroller 404 reads the measurements of the capacitive sensor 416 every 1.999 seconds. In implementations, the microcontroller 404 takes only 0.001 seconds to read the measurement and determine whether the status of the work station (e.g., occupied or unoccupied) has changed. In embodiments, the microcontroller 404 includes storage, which records prior state readings of the microcontroller 404. In one example, the storage of the microcontroller 404 records nine (9) events in the form of three (3) oldest reading states (occupied or unoccupied states), three (3) medium states, and three (3) newest states. In aspects, the microcontroller 404 compares the combined oldest state readings and medium state readings with the newest readings to determine if there is a status change at the work station 200A (e.g., a change from an occupied status to an unoccupied status).

In aspects, the idle time threshold parameter is highly customizable to reflect the profile of the professionals who will be occupying the work stations 200A-200C. For example, the idle time threshold parameter may take into account break times (e.g., scheduled breaks, coffee breaks, etc.). In implementations, a client can set the idle time threshold parameter to prevent the microcontroller 404 from determining that a person has left a work station 200A if the person temporarily leaves and returns to the work station 200A within the predetermined idle time threshold. For example, the idle time threshold parameter may be set at 15 minutes, wherein the microcontroller 404 does not determine an absence of the person when the person leaves the work station 200A for a time period of 15 minutes or less.

At step 513, the radio circuit 402 sends a new alert to the gateway 204 based on the determination at step 512 that the work station is unoccupied. In implementations, the radio circuit 402 sends the alert to more than one gateway 204. In aspects, the microcontroller 404 changes the status of the radio circuit 402 from a sleep state to a wake state upon detecting that the work station has changed from an occupied state to an unoccupied state, wherein the power circuit 400 provides power to the radio circuit 402 to enable the radio circuit 402 to transmit the new alert to the gateway 204. In aspects, the transmission of the alert by the radio circuit 402 is completed in approximately 3 ms, and only occurs when there is a change of status (e.g., occupied to unoccupied) of the work station 200A as determined by the microcontroller 404 at step 512. In embodiments the antenna 412 of the radio circuit 402 sends the new alert using a radio frequency sub gigabit standard (e.g., IEEE 802.15.4), wherein the new alert includes data regarding an ID of the proximity detector 202 and an indication of a change in occupancy status of the work station 200A.

At step 514, the gateway 204 sends the new message to the server 206 based on the new alert received by the presence detector 202 to update the status of the work station 200A from an occupied status to an unoccupied status. In aspects the IoT platform 210 of the gateway 204 receives the new alert as unstructured data, and outputs the new message to the server 206 in an encrypted MQTT protocol format.

At step 515, the server 206 sends instructions to one or more IoT devices A and B to initiate one or more functions based on the new message. In implementations, the new message received at the server 206 causes the server 206 to recognize a change in occupancy status at the work station 200A from occupied to unoccupied and sends instructions to one or more IoT devices A and B based thereon. In one example, the instructions from the server 206 cause a lighting system to change ambient lighting in the environment 50. In another example, the instructions from the server 206 cause an air conditioning system to change ambient temperature in the environment 50.

As noted above, various parameters stored at the microcontroller 404 may be customized or updated in order to better preserve battery life of the presence detector 202 and provide the desired control for status updates (occupied/unoccupied updates) for the work station 200A. Accordingly, at step 516, the client may send input to the server 206 regarding parameters of the presence detector.

At step 517, the server 206 sends the gateway 204 instructions to update the microcontroller 404 based on the input received at step 516. In embodiments, the gateway 204 processes input data received from the server 206 into a different format digestible by the microcontroller 404.

At step 518, the gateway 204 sends the microcontroller 404 instructions to update parameters, and the microcontroller 404 updates stored parameters based on the instructions. The stored parameters may be, for example, time periods between sleep/awake states, the idle time threshold value, changes to measurement ranges indicating the presence of people at a presence detector, and time periods between battery status checks.

Unless otherwise noted, steps illustrated in FIGS. 5A and 5B may be performed in a different order than depicted. For example, steps 507-510 may be performed at any time in accordance with predetermined parameters stored at the microcontroller 404.

One major challenge of battery-powered capacitive detectors of embodiments of the present invention is the detector's high sensitivity to external noise, due in part to the absence of a real earth ground reference and the interference of atmospheric variables such as temperature and humidity that cause a drift in the signal. The effects of temperature and humidity cause slow drifts in the signal from the capacitive sensor 416, since these quantities do not vary abruptly. In order to compensate, embodiments of the invention utilize an Infinite Impulse Response (IIR) filter and a slow-moving average to reduce noise and to improve the signal to noise ratio.

Figure 6:
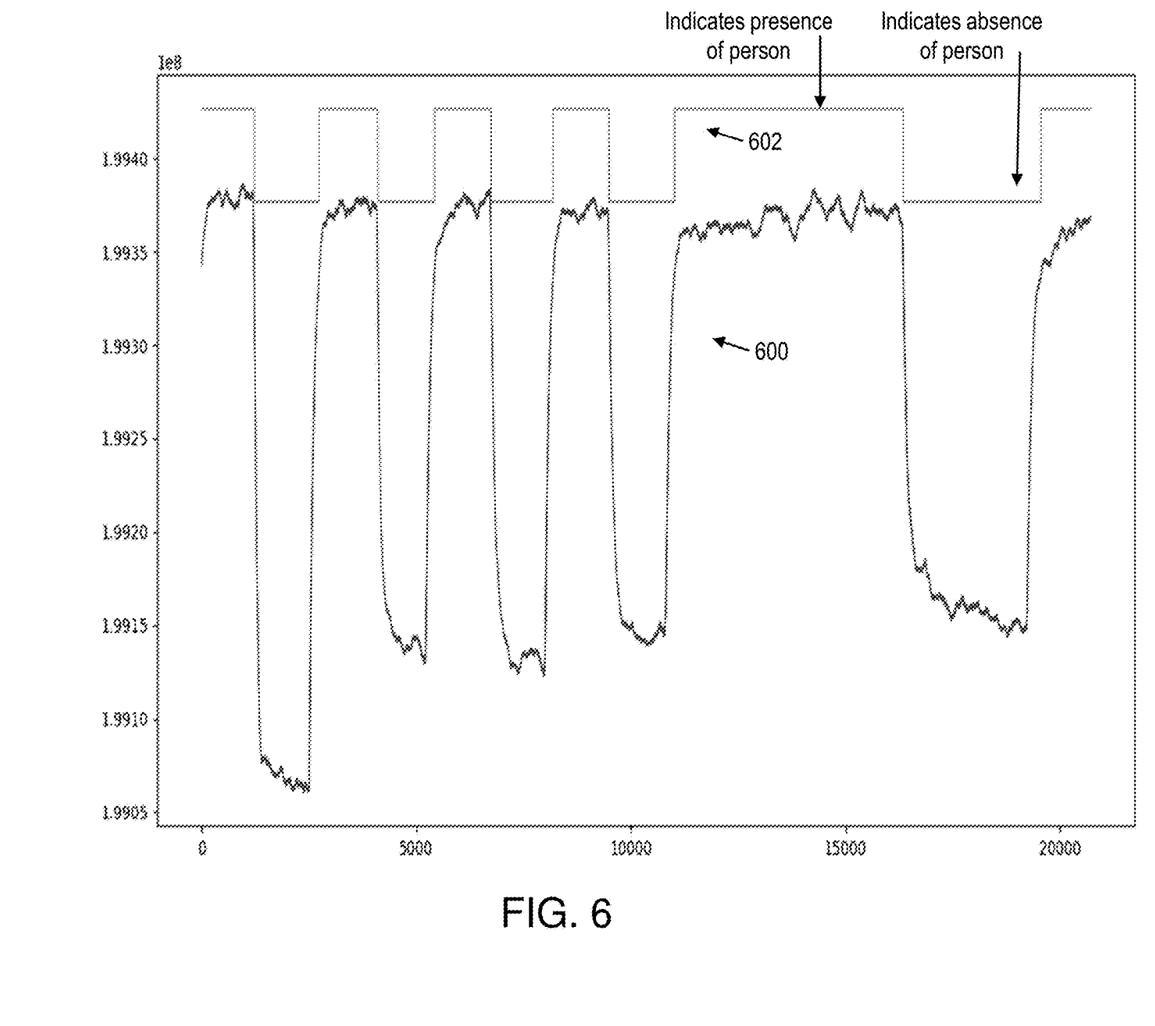
FIG. 6 is a graph depicting a compensated signal produced using an IIR filter in accordance with embodiments of the invention.

FIG. 6 is a graph depicting a compensated signal produced using an IIR filter in accordance with embodiments of the invention. A bottom curve 600 of the FIG. 6 graph illustrates a variation in capacitance over time after a person at a work station rises and sits four (4) times in a 15 second interval, is absent for one (1) minute, then returns for another 45 seconds. The bottom curve 600 is depicted as having some noise remaining after temperature drift compensation and noise filters are applied. However, the relationship between the signal and the noise allows the identification of the presence of a person with clarity. For example, the top curve 602 of the FIG. 6 graph illustrates decision-making by the microcontroller 404 regarding whether the person is present or absent at the work station.

Thus, embodiments of the invention provide a device to detect the occupancy of corporate work positions (e.g., at work stations) with lower operational cost and greater accuracy in the information pointing, thus avoiding maintenance concerns and false positives (e.g., mistaken detection of the presence of a person in a working position at a work station).

In embodiments, a service provider could offer to perform the processes described herein. In this case, the service provider can create, maintain, deploy, support, etc., the computer infrastructure that performs the process steps of the invention for one or more customers. These customers may be, for example, any business that uses technology. In return, the service provider can receive payment from the customer(s) under a subscription and/or fee agreement and/or the service provider can receive payment from the sale of advertising content to one or more third parties.

In still another embodiment, the invention provides a computer-implemented method for wireless capacitive presence detection. In this case, a computer infrastructure, such as computer system 12 (FIG. 1), can be provided and one or more systems for performing the processes of the invention can be obtained (e.g., created, purchased, used, modified, etc.) and deployed to the computer infrastructure. To this extent, the deployment of a system can comprise one or more of: (1) installing program code on a computing device, such as computer system 12 (as shown in FIG. 1), from a computer-readable medium; (2) adding one or more computing devices to the computer infrastructure; and (3) incorporating and/or modifying one or more existing systems of the computer infrastructure to enable the computer infrastructure to perform the processes of the invention.

In still another embodiments, an apparatus for presence indication comprises: a power circuit comprising a battery and a low power direct current to direct current converter supplying a stable voltage during life of the battery; a radio circuit capable of sending an alert, connected to the power circuit through the microcontroller, and comprising a digital low power signal less than gigahertz using an IEEE802.15.4 stack; a sensor circuit, connected to the power circuit through the microcontroller, and comprising a capacitive sensor, a tank oscillator and a balanced electrode, wherein the capacitive sensor measures a distortion on an electric field, generated by the tank oscillator, applied to the balanced electrode; and a control circuit connected to the power circuit and comprising a microcontroller managing a plurality of circuits attached and capable of generating the alert using a result received from the sensor circuit indicating a presence according to predetermined criteria.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
   generating, by a tank circuit of a wireless presence detector, an electric field applied to an electrode of the wireless presence detector utilizing power from a battery of the wireless presence detector;
   measuring, by a capacitive sensor of the wireless presence detector, a change in capacitance of the electrode;
   determining, by a microcontroller of the wireless presence detector, that the change in capacitance indicates a presence of a person within a predetermined distance of the electrode; and
   sending, by a radio circuit of the wireless presence detector, an alert to a remote gateway using a radio frequency sub-gigahertz transmission, wherein the alert is based on the determining that the change in capacitance indicates the presence of a person within the predetermined distance of the electrode.

2. The computer-implemented method of claim 1, further comprising:
   awaking, by the microcontroller, the wireless presence detector from a dormant state to a wake state according to a predetermined protocol prior to measuring the change in capacitance; and
   returning, by the microcontroller, the wireless presence detector from the wake state to the dormant state after the sending of the alert.

3. The computer-implemented method of claim 2, wherein the wake state is in an order of milliseconds.

4. The computer-implemented method of claim 1, wherein the alert is sent utilizing IEEE802.15.4 protocol.

5. The computer-implemented method of claim 1, further comprising:
   measuring, by a power manager, a voltage of the battery according to predetermined battery testing parameters;
   determining, by the microcontroller, a low battery state based on the measuring; and
   sending, by the radio circuit, a low battery alert to the gateway.

6. The computer-implemented method of claim 1, further comprising receiving, by the microcontroller, instructions from the gateway to update parameters stored at the microcontroller.

7. The computer-implemented method of claim 1, further comprising:
   measuring, by the capacitive sensor, another change in capacitance of the electrode;
   determining, by the microcontroller, that the other change in capacitance indicates an absence of a person within the predetermined distance of the electrode for a predetermined period; and
   sending, by the radio circuit, a second alert to the remote gateway, wherein the second alert is based on the determining that the other change in capacitance indicates the absence of the person within the predetermined distance of the electrode for the predetermined period.

8. A wireless capacitive presence detector comprising:
   a power circuit including a battery and a power manager configured to supply a stable voltage to a microcontroller during a life of the battery;
   a radio circuit connected to the power circuit through the microcontroller, the radio circuit configured to send an alert comprising a digital low power signal of less than 1 gigahertz; and
   a sensor circuit connected to the power circuit through the microcontroller, the sensor circuit including a capacitive sensor, a tank oscillator and an electrode, wherein the capacitive sensor is configured to measure a distortion on an electric field generated by the tank oscillator and applied to the electrode;
   wherein the microcontroller is configured to monitor for a presence or absence of a person within a predetermined distance of the electrode periodically in real-time, and generate the alert based on the distortion measured by the capacitive sensor when the distortion indicates the presence of the person within the predetermined distance of the electrode according to predetermined parameters stored at the microcontroller or the absence of the person for a predetermined period of time according to the predetermined parameters stored at the microcontroller.

9. The wireless capacitive presence detector of claim 8, wherein the microcontroller is configured to switch from a dormant state wherein the microcontroller does not read the distortion measured by the capacitive sensor, to a wake state wherein the microcontroller does read the distortion measured by the capacitive sensor, based on a predetermined protocol, wherein the wake state is in an order of milliseconds.

10. The wireless capacitive presence detector of claim 8, wherein the microcontroller is in communication with a gateway, and the microcontroller is adapted to send the alert to the gateway using an IEEE802.15.4 communication protocol.

11. The wireless capacitive presence detector of claim 8, wherein the capacitive sensor is configured to identify capacitive variations in surroundings of the electrode at a distance of up to 20 cm from the electrode.

12. The wireless capacitive presence detector of claim 8, wherein the electric field has a frequency of less than 10 megahertz.

13. A system comprising:
   a wireless presence detector affixed to a work station comprising:

a power circuit including a battery and a power manager configured to supply a stable voltage to a microcontroller during a life of the battery;
a radio circuit connected to the power circuit through the microcontroller, the radio circuit configured to send an alert comprising a digital low power signal of less than 1 gigahertz; and
a sensor circuit connected to the power circuit through the microcontroller, the sensor circuit including a capacitive sensor, a tank oscillator and an electrode, wherein the capacitive sensor is configured to measure changes in capacitance of the electrode due to distortions in an electric field generated by the tank oscillator, and the microcontroller is configured to monitor for a presence or an absence of a person within a predetermined distance of the electrode; and
a gateway in wireless communication with the wireless presence detector, wherein the gateway is adapted to receive alerts from the radio circuit indicating a change in an occupancy status of the work station based on the monitoring and transmit messages to a server indicating the change in occupancy status of the work station.

14. The system of claim 13, wherein the microcontroller includes:
a processor, a computer readable memory and a computer readable storage medium associated;
program instructions to measure a change in capacitance of the electrode;
program instructions to determine that the change in capacitance indicates the presence of a person within the predetermined distance of the electrode; and
program instructions to send the alert to the gateway using a radio frequency sub-gigahertz transmission, wherein the alert is based on the determining that the change in capacitance indicates the presence of a person within the predetermined distance of the electrode,
wherein the program instructions are stored on the computer readable storage medium for execution by the processor via the computer readable memory.

15. The system of claim 14, wherein the microcontroller further comprises:
program instructions to transition the wireless presence detector from a dormant state to a wake state according to a predetermined protocol prior to the measuring the change in capacitance; and
program instructions to return the wireless presence detector from the wake state to the dormant state after the sending of the alert.

16. The system of claim 15, wherein the wake state is in an order of milliseconds.

17. The system of claim 14, wherein the alert is sent to the gateway utilizing IEEE802.15.4 protocol.

18. The system of claim 14, wherein the microcontroller further comprises:
program instructions to measure a voltage of the battery according to predetermined parameters;
program instructions to determine a low battery state based on the measuring; and
program instructions to send a low battery alert to the gateway based on the determining the low battery state.

19. The system of claim 14, further comprising program instructions to receive user-implemented instructions from the gateway to update parameters stored at the microcontroller.

20. The system of claim 14, wherein the microprocessor further comprises:

program instructions to measure another change in capacitance of the electrode;
program instructions to determine that the other change in capacitance indicates an absence of a person within the predetermined distance of the electrode for a predetermined period; and
program instructions to send a second alert to the remote gateway, wherein the second alert is based on the determining that the change in capacitance indicates the absence of the person within the predetermined distance of the electrode for the predetermined period.

21. A system comprising:
a plurality of wireless presence detectors, wherein each of the plurality of wireless presence detectors is associated with one of a plurality of work stations in a work environment and includes:
a power circuit including a battery and a power manager configured to supply a stable voltage to a microcontroller during a life of the battery;
a radio circuit connected to the power circuit through the microcontroller, the radio circuit configured to send an alert comprising a digital low power signal of less than 1 gigahertz; and
a sensor circuit connected to the power circuit through the microcontroller, the sensor circuit including a capacitive sensor, a tank oscillator and an electrode, wherein the capacitive sensor is configured to measure changes in capacitance of the electrode due to distortions in an electric field generated by the tank oscillator and the microcontroller is configured to monitor for a presence or an absence of a person within a predetermined distance of the electrode; and
a gateway in wireless communication with the plurality of wireless presence detectors, wherein the gateway is adapted to receive radio frequency sub-gigahertz alerts from the plurality of wireless presence detectors indicating a change in an occupancy status of an associated one of the plurality of work stations based on the monitoring, and transmit encrypted messages to a remote server via a network indicating the change in occupancy status of the associated one of the plurality of work stations.

22. The system of claim 21, wherein each of the plurality of wireless presence detectors includes an identification, and wherein the radio frequency sub-gigahertz alerts include the identification and an indication of a change in the occupancy status of an associated one of the plurality of work stations.

23. A system comprising:
a gateway in communication with a server via a network; and
a plurality of wireless presence detectors, wherein each of the plurality of wireless presence detectors is associated with one of a plurality of work stations in a work environment and includes:
a battery;
a radio circuit;
an electrode; and
a microcontroller having a processor, a computer readable memory and a computer readable storage medium associated with the microprocessor;
program instructions to monitor for a presence or absence of a person within a predetermined distance of the electrode based on measuring a change in capacitance of the electrode;
program instructions to determine that the change in capacitance indicates a change in an occupancy status of an associated one of the plurality of work stations, wherein the occupancy status includes an occupied status and an unoccupied status; and program instructions to send an alert to the gateway via the radio circuit using a radio frequency sub-gigahertz transmission, wherein the alert is based on the determining the change in the occupancy status, and wherein the program instructions are stored on the computer readable storage medium for execution by the microcontroller via the computer readable memory.

24. The system of claim 23, further comprising the server, wherein the server includes a second processor, a second computer readable memory and a second computer readable storage medium associated with the server;

program instructions of the server to receive a message from the gateway indicating the change in the occupancy status of the associated one of the plurality of work stations; and program instructions of the server to initiate changes in one or more internet of things devices in communication with the server based on the change in the occupancy status of the associated one of the plurality of work stations, wherein the program instructions of the server are stored on the second computer readable storage medium for execution by the second processor via the second computer readable memory.

25. The system of claim 24, wherein the alert is in the form of a radio frequency sub-gigahertz transmission, and the message is an encrypted Message Queuing Telemetry Transport (MQTT) protocol message.

* * * * *